United States Patent
Okamura et al.

[11] Patent Number: 6,143,619
[45] Date of Patent: Nov. 7, 2000

[54] METHOD FOR MANUFACTURING SEMICONDUCTOR DEVICE AND SEMICONDUCTOR DEVICE MANUFACTURING APPARATUS

[75] Inventors: Kenji Okamura; Shuji Fujiwara; Takao Katuyama, all of Tokyo, Japan

[73] Assignee: NEC Corporation, Tokyo, Japan

[21] Appl. No.: 09/116,899

[22] Filed: Jul. 17, 1998

[30] Foreign Application Priority Data

Jul. 18, 1997 [JP] Japan ................................. 9-194419

[51] Int. Cl.[7] ........................................ H01L 21/20
[52] U.S. Cl. ................... 438/398; 438/397; 438/210; 438/239; 438/542; 438/255; 117/103; 117/97; 117/98; 117/105
[58] Field of Search ........................ 438/398, 397, 438/210, 239, 542, 255; 117/103, 97, 98, 105

[56] References Cited

U.S. PATENT DOCUMENTS

| | | | |
|---|---|---|---|
| 4,877,757 | 10/1989 | York et al. | 437/235 |
| 4,890,780 | 1/1990 | Mimata et al. | 228/4.5 |
| 5,429,642 | 7/1995 | Ohkuma | 29/25.01 |
| 5,518,542 | 5/1996 | Matsukawa et al. | 118/52 |
| 5,634,974 | 6/1997 | Weimer et al. | 117/103 |
| 5,798,455 | 8/1998 | Sakata et al. | 73/64.48 |

FOREIGN PATENT DOCUMENTS

| | | |
|---|---|---|
| 0 626724 A1 | 12/1993 | European Pat. Off. . |
| 0 736 895 A1 | 10/1996 | European Pat. Off. . |
| 2-222518 | 9/1990 | Japan . |
| 6-20906 | 1/1994 | Japan . |

OTHER PUBLICATIONS

British Search Report dated Oct. 21, 1998.

*Primary Examiner*—David Nelms
*Assistant Examiner*—Quoc Hoang
*Attorney, Agent, or Firm*—McGinn & Gibb, P.C.

[57] ABSTRACT

A method of manufacturing a semiconductor device contains a first treatment step of removing a silicon oxide film on a semiconductor substrate (15) in a rare hydrofluoric acid treatment device (12), a second treatment step of forming hemispherical grained silicon on the semiconductor substrate (15) in an HSG-Si forming device (13), and a step of moving the semiconductor substrate (15) treated in the first treatment step to the HSG-Si forming device (13) by means of a semiconductor substrate moving device (14), wherein filtering an air in the semiconductor substrate moving device (14) is conducted so that an amount of organic materials which adhere onto a surface of the semiconductor substrate (15) during a process to the second treatment step is set to 1 ng/cm$^2$ or less.

13 Claims, 3 Drawing Sheets

METHOD FOR MANUFACTURING SEMICONDUCTOR DEVICE AND SEMICONDUCTOR DEVICE MANUFACTURING APPARATUS

BACKGROUND OF THE INVENTION

1. Field of the Invention

The present invention relates to a method of manufacturing semiconductor device such as DRAM, and a manufacturing apparatus which is suitably used for the manufacturing method. In particular, the present invention is suitably used for manufacturing DRAM capacitor electrode having uneven (rough) surface, and applied to manufacturing apparatus which is suitably used for the manufacturing method.

2. Description of the Related Art

According to high-integration design of DRAMs, transistors and capacitors which serve as constituent elements of the DRAMs have been designed to be more reduced in area every time the generation of the DRAMs is changed. With respect to the capacitors, a capacitance value of a predetermined value or more, for example about 25 fF, is required to maintain the resistance to soft errors. Therefore, recently, cubic design of the capacitor electrodes has being promoted with the increase of the surface area of electrodes of the capacitors. Hemispherical Grained Silicon (hereinafter referred to as "HSG-Si") is a representative example of solid electrodes, and it is expected as electrodes of high-integrated DRAM at the 64-Mbits DRAM and subsequent generations because it can approximately double the surface area.

FIGS. 1A to 1D show a method of manufacturing capacitor electrodes having HSG-Si.

As shown in FIG. 1A, an insulating film 2 is formed on a semiconductor substrate 1, and then a contact hole 3 is formed in the insulating film 2. Subsequently, a phosphorus-doped amorphous silicon film is formed, and then etched in a predetermined shape to form a capacitor electrode (lower electrode) 4. In this state, the surface of the capacitor electrode 4 is covered by a natural oxide film 5.

Subsequently, a rare hydrofluoric acid treatment is performed, and the natural oxide film 5 on the surface of the capacitor electrode 4 is removed to form a hydrogen-terminated clean silicon surface 6 as shown in FIG. 1B.

Thereafter, silane gas is blown under a high vacuum condition, and then a heat treatment is performed under a high vacuum atmosphere. These steps are performed in order to form HSG-Si 7 on the capacitor electrode 4 as shown in FIG. 1C.

Thereafter, a step of forming a capacitor insulation film and a step of forming a capacitor upper electrode are carried out to form a capacitor of the DRAM.

In a semiconductor device manufacturing factory, an apparatus for performing the rare hydrofluoric acid treatment and an apparatus for forming HSG-Si are isolatively disposed in a clean room.

FIG. 2 is a plan view showing a conventional layout example of these apparatuses. As shown in FIG. 2, the rare hydrofluoric acid treatment apparatus 12 and the HSG-Si forming apparatus 13 are isolatively disposed while each of them faces to the bay 11 of the clean room. The semiconductor substrate 15 is accommodated in a carrier cassette 16, and moved to the rare hydrofluoric acid apparatus 12 by means such as AGV (Automated Guided Vehicle: not shown in FIG. 2) or the like (①, ②). After the treatment in the rare hydrofluoric acid apparatus 12 is completed, the semiconductor substrate 15 is moved to the HSG-Si forming apparatus by means such as AGV or the like again (③, ④, ⑤) to form HSG-Si. After the treatment in the HSG-Si forming apparatus 13 is completed, then the semiconductor substrate 15 is moved to the next capacitor insulation film forming step (⑥, ⑦).

However, in the HSG-Si forming step of the above conventional semiconductor manufacturing process, reproducibility of the shape of HSG-Si is low, and there usually occurs a problem that HSG-Si 7 cannot be formed on the surface of the capacitor electrode 4 as shown in FIG. 1D. As a result, the capacitance value of the DRAM capacitor is reduced, so that there occurs such a critical problem that the manufacturing yield and reliability of the DRAMs are lowered.

SUMMARY OF THE INVENTION

An object of the present invention is to provide a method of forming a semiconductor device having HSG-Si surface with high reproducibility, and a semiconductor device manufacturing apparatus which can form HSG-Si with high reproducibility.

In order to attain the above object, a method of manufacturing a semiconductor device according to a first aspect of the present invention comprises a first treatment step of performing a first treatment on a semiconductor substrate, a second treatment step of performing a second treatment on the semiconductor substrate treated in the first treatment step, and a step of moving the semiconductor substrate treated in the first treatment step to a position for the second treatment step, wherein an amount of organic materials which adhere onto a surface of the semiconductor substrate during a process to the second treatment step is set to 1 ng/cm$^2$ or less.

In the manufacturing method, the first treatment step is a step of removing a silicon oxide film on the semiconductor substrate. Further, the second treatment step is a step of forming hemispherical grained silicon on the semiconductor substrate. The step of moving the semiconductor substrate can be performed with filtering an ambient air so as to prevent adherence of the organic materials onto the semiconductor substrate.

Further, a semiconductor manufacturing apparatus according to a second aspect of the present invention includes a first treatment device for performing a first treatment on a semiconductor substrate, a second treatment device for performing a second treatment on the semiconductor substrate treated by the first device, a device for moving the semiconductor substrate from the first device to the second device, and a device for removing organic materials so as to prevent adherence of the organic materials onto the semiconductor substrate which is moved by the device for moving the semiconductor substrate.

In the manufacturing apparatus, the first device is a device for removing a silicon oxide film on the semiconductor substrate. Further, the second device is a device for forming hemispherical grained silicon on the semiconductor substrate. Preferably, the device for removing organic materials is provided with an air circulating mechanism containing a chemical filter so as to set an amount of organic materials which adhere onto a surface of the semiconductor substrate to 1 ng/cm$^2$ or less.

According to the present invention, the amount of organic materials which adhere to the surface of the semiconductor substrate during the process from the step of performing the rare hydrofluoric acid treatment on the semiconductor substrate until the HSG-Si forming step is kept to be equal to 1 ng/cm$^2$ or below, whereby HSG-Si can be formed with high reproducibility, and the capacitance of capacitors of the DRAM can be stabilized to enhance the manufacturing yield and the reliability of the DRAMs.

DETAILED DESCRIPTION OF THE PREFERRED EMBODIMENT

Preferred embodiment according to the present invention will be described with reference to the accompanying drawings.

Figure 1A:
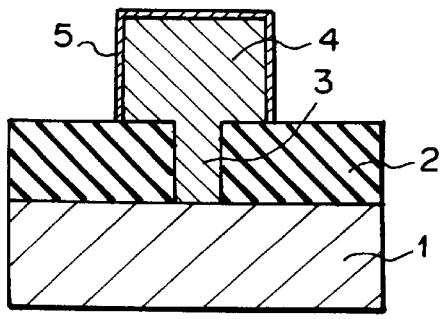
FIGS. 1A to 1D are cross-sectional views showing a manufacturing method of a capacitor electrode of DRAM of a prior art.
Figure 1B:
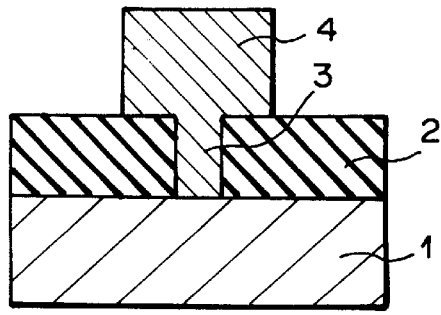
Figure 1C:
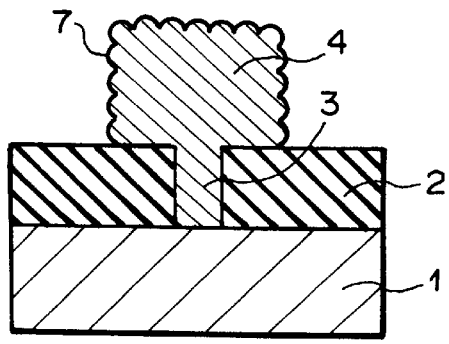
Figure 1D:
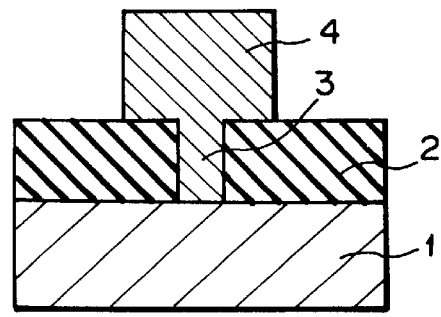
Figure 2:
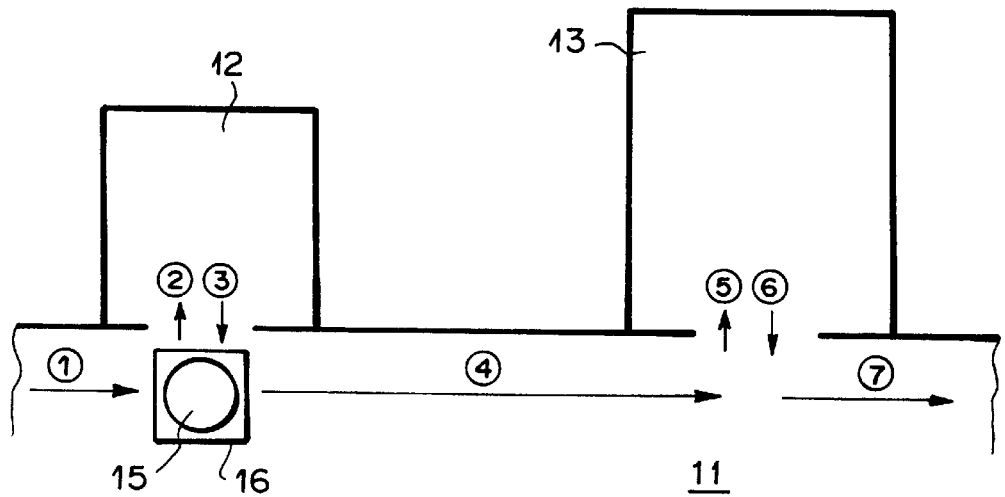
FIG. 2 is a plan view showing a semiconductor manufacturing apparatus of the prior art.
Figure 3A:
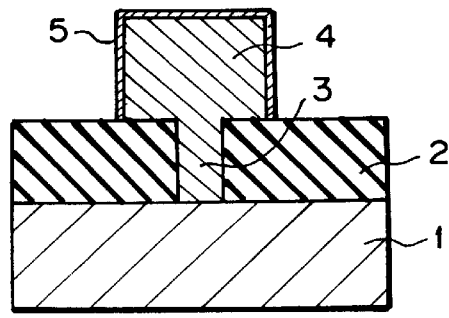
FIGS. 3A to 3C are cross-sectional views showing the process of a method of manufacturing a semiconductor device, especially a capacitor electrode of DRAM, according to an embodiment of the present invention.
Figure 3B:
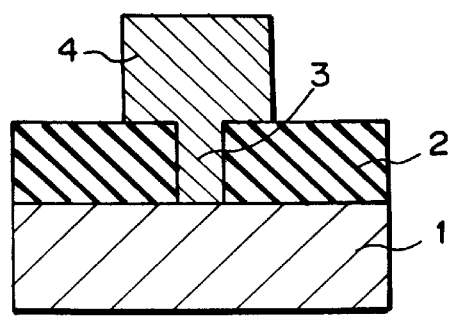
Figure 3C:
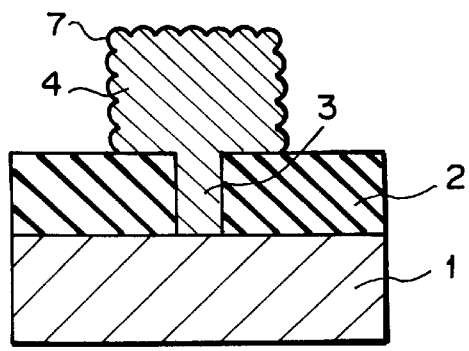

FIGS. 3A to 3C are cross-sectional views showing the process of a method of manufacturing a semiconductor device according to an embodiment of the present invention.

As shown in FIG. 3A, an insulating film 2 is formed on a semiconductor substrate 1, and a contact hole 3 is formed in the insulating film 2. Subsequently, a phosphorus-doped amorphous silicon film is formed, and then etched in a predetermined shape to form a capacitor electrode (capacitor lower electrode) 4. In this state the surface of the capacitor electrode 4 is covered by a natural oxide film 5.

Subsequently, a rare hydrofluoric acid treatment is carried out and, as shown in FIG. 3B, the natural oxide film 5 on the surface of the capacitor electrode 4 is removed to form a hydrogen-terminated clean silicon surface 6.

Subsequently, after silane gas is blown under a high-vacuum condition, a heat treatment is carried out under a high vacuum atmosphere to form HSG-Si 7 on the capacitor electrode 4 (FIG. 3C).

According to this embodiment, after the rare hydrofluoric acid treatment step is completed, the amount of organic materials which adhere onto the surface of the semiconductor substrate, especially the surface of the capacitor electrode 4, during the process until the step of forming HSG-Si is reduced to 1 ng/cm$^2$ or less, whereby the reproducibility of the shape of HSG-Si 7 is enhanced.

After the step of forming HSG-Si 7, the capacitor of DRAM is completed through the step of forming the capacitor insulating film on the capacitor lower electrode 4, and the step of forming the capacitor upper electrode on the capacitor insulating film.

Figure 4A:
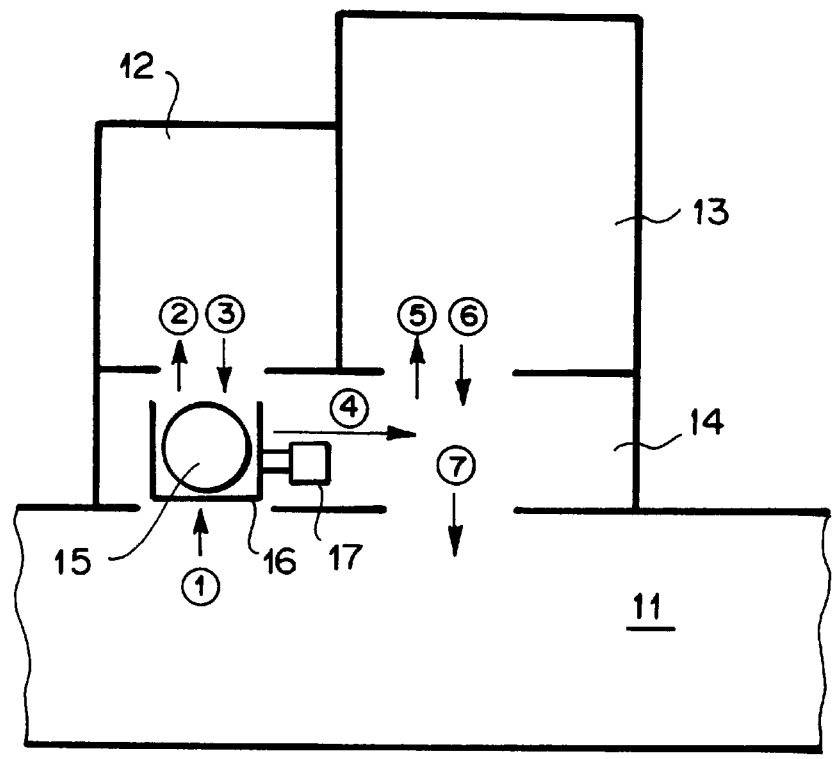
FIG. 4A is a plan view showing a semiconductor manufacturing apparatus according to the embodiment of the present invention.
Figure 4B:
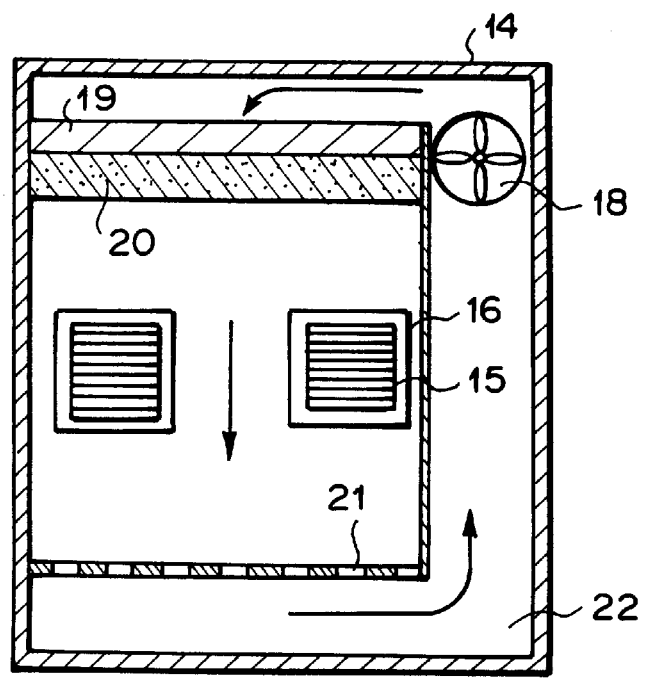
FIG. 4B is a cross-sectional view of the semiconductor manufacturing apparatus of the embodiment.

FIG. 4A is a plan view showing a semiconductor device manufacturing apparatus according to an embodiment of the present invention, and FIG. 4B is a cross-sectional view of the semiconductor device manufacturing apparatus.

As shown in FIG. 4A, the semiconductor device manufacturing apparatus according to this embodiment comprises the following three main devices, that is, a rare hydrofluoric acid treatment device 12, an HSG-Si forming device 13 and a semiconductor substrate moving device 14. These devices are mutually linked to one another, and disposed so that the semiconductor substrate moving device 14 faces to a clean room bay 11.

A semiconductor substrate 15 is accommodated in a carrier cassette 16, and disposed in the semiconductor substrate moving device 14 (①) by a means such as AGV (Automated Guided Vehicle) or the like. Thereafter, the semiconductor substrate 15 is moved to the rare hydrofluoric acid treatment device 12 by a means for moving the semiconductor substrate 15, for example, a carrier feeding robot 17 (②).

After the treatment in the rare hydrofluoric acid treatment device 12 is completed, the semiconductor substrate 15 is moved to the HSG-Si forming device 13 by the carrier feeding robot 17 (③, ④, ⑤) to form HSG-Si 7.

After the treatment in the HSG-Si forming device 13 is completed, the semiconductor substrate 15 is moved to the semiconductor substrate moving device 14 by the carrier feeding robot 17 (⑥).

Thereafter, the semiconductor substrate 15 is disposed in the AGV or the like (⑦), and moved to the next capacitor insulating film forming step by the AGV or the like.

In each of the above-mentioned states ①, ②, ③, ⑤, ⑥ and ⑦, the semiconductor substrate 15 passes through a doorway provided on the wall of the semiconductor substrate moving device 14, the rare hydrofluoric acid treatment device 12 or the HSG-Si forming device 13.

As shown in FIG. 4B, the semiconductor substrate moving device 14 has a chemical filter 19 containing active charcoal for adsorbing organic materials, for example MEK (methyl ethyl ketone), DOP (dioctyl phthalate), siloxane, etc. Air which is fed to the chemical filter 19 and an ULPA filter (ultra low penetration air-filter) 20 by an air blower 18 is cleaned by removing organic materials, particles, etc. therefrom, and then supplied to the semiconductor substrate 15. This clean air is passed through a suck-in port 21 comprising punching metal disposed below the semiconductor substrate 15, and circulated via a passage 22 by the air blower 18. Air flow is indicated by arrows in FIG. 4B. The circulation rate can be freely varied by varying the opening rate of the suck-in port 21 and an outside air inlet port (not shown).

The semiconductor substrate 15 is moved under a clean air atmosphere, and thus the amount of the organic materials adhering onto the surface of the semiconductor substrate 15 during movement is kept to be below 1 ng/cm$^2$.

Figure 5:
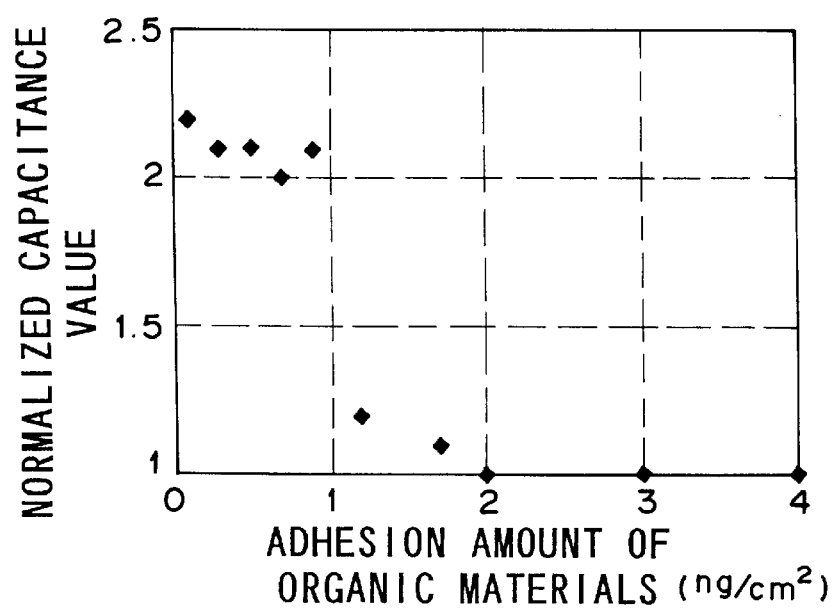
FIG. 5 is a characteristic diagram showing the dependence of capacitance value on adhesion amount of organic material.

FIG. 5 shows the relationship between the capacitance value of the capacitor and the amount of the organic materials which have adhered to the surface of the semiconductor substrate 15 during the movement of the semiconductor substrate after the rare hydrofluoric acid treatment is carried out until the formation of HSG-Si is started.

In FIG. 5, the capacitance value is normalized, and the capacitance value when HSG-Si is not formed is set to 1. It is apparent from FIG. 5 that if the adherence amount of the organic materials exceeds 1 ng/cm$^2$, the capacitance value would be critically reduced.

As a result of considerations based on a measurement result shown in FIG. 5, the inventors of this application have concluded that a criterion for judging whether HSG-Si 7 is sufficiently formed or not can be employed on the basis of a predetermined adhesion amount of the organic amounts which is equal to about 1 ng/cm$^2$. Further, it is considered that silicon atoms moves on the surface of the phosphorus-doped amorphous silicon film of the capacitor electrode 4 and hemispherical crystal grains are formed thereon, thereby forming the HSG-Si 7 on the surface of the phosphorus-doped amorphous silicon film. It is understood that if organic materials exist on the surface of the semiconductor substrate including the surface of the phosphorus-doped amorphous silicon film of the capacitor electrode 4, the movement of the silicon atoms thereon is disturbed and sufficient HSG-Si 7 cannot be obtained. Further, it is considered that organic materials existing in the clean room bay 11 are discharged from the constituent materials of the clean room or in another semiconductor manufacturing step.

Therefore, after the rare hydrofluoric acid treatment step is completed, the adhesion amount of organic materials onto the surface of the semiconductor substrate during the process until the HSG-Si forming step is made to 1 ng/cm$^2$ or less, thereby enhancing the reproducibility of the shape of HSG-Si 7. According to this embodiment, as shown in FIG. 5, the adhesion amount of organic materials is set to 1 ng/cm$^2$ or less to increase the capacitance value to 2 or more.

According to the graph of FIG. 5, the increase of the capacitance value to 2 or more means that the reproducibility of the shape of HSG-Si. Therefore, according to this embodiment, the capacitance value of the DRAM capacitor can be increased, and the manufacturing yield and the reliability of the DRAM can be enhanced.

What is claimed is:

1. A method of manufacturing a semiconductor device comprising:

performing a first treatment on a semiconductor substrate;

performing a second treatment on the semiconductor substrate treated in the first treatment; and moving the semiconductor substrate treated in the first treatment to a position for the second treatment and controlling an amount of organic materials which adheres onto a surface of the semiconductor substrate during a process to the second treatment to 1 ng/cm$^2$ or less.

2. The method of manufacturing a semiconductor device as claimed in claim 1, wherein said first treatment comprises removing a silicon oxide film on the semiconductor substrate.

3. The method of manufacturing a semiconductor device as claimed in claim 1, wherein said second treatment comprises forming hemispherical grained silicon on the semiconductor substrate.

4. The method of manufacturing a semiconductor device as claimed in claim 1, wherein said controlling comprises filtering an ambient air so as to prevent adherence of the organic materials onto the semiconductor substrate.

5. A method of manufacturing a semiconductor device comprising:

performing a first treatment on a semiconductor substrate;

performing a second treatment on the semiconductor substrate treated in the first treatment; and controlling an amount of organic materials which adheres onto a surface of the semiconductor substrate at a beginning of the second treatment, said amount of organic materials being controlled to 1 ng/cm$^2$ or less.

6. The method of manufacturing a semiconductor device as claimed in claim 5, wherein said first treatment comprises removing a silicon oxide film on the semiconductor substrate.

7. The method of manufacturing a semiconductor device as claimed in claim 5, wherein said second treatment comprises forming hemispherical grained silicon on the semiconductor substrate.

8. The method of manufacturing a semiconductor device as claimed in claim 5, wherein said controlling comprises controlling filtering an ambient air so as to prevent adherence of the organic materials onto the semiconductor substrate.

9. A method of manufacturing a semiconductor device comprising:

performing a first processing on a semiconductor substrate;

performing a second processing on the semiconductor substrate treated in the first processing; and controlling an amount of organic materials which adheres onto a surface of the semiconductor substrate prior to starting the second processing, said amount of organic materials being controlled to 1 ng/cm$^2$ or less.

10. The method of manufacturing a semiconductor device as claimed in claim 9, wherein said first processing comprises removing a silicon oxide film on the semiconductor substrate.

11. The method of manufacturing a semiconductor device as claimed in claim 10, wherein said removing comprises processing with a hydrofluoric acid.

12. The method of manufacturing a semiconductor device as claimed in claim 9, wherein said second processing comprises forming hemispherical grained silicon on the semiconductor substrate.

13. The method of manufacturing a semiconductor device as claimed in claim 9, wherein said controlling comprises controlling filtering an ambient air so as to prevent adherence of the organic materials onto the semiconductor substrate.

* * * * *